US007482534B2

(12) United States Patent
Ye

(10) Patent No.: US 7,482,534 B2

(45) Date of Patent: Jan. 27, 2009

(54) LIGHT SWITCH WITH LIGHT REGULATOR

(76) Inventor: Quan-Li Ye, Wan-ao Village, Yueching District, Yue-qing City, Zhejiang Province, P.R. (CN) 325600

( * ) Notice: Subject to any disclaimer, the term of this patent is extended or adjusted under 35 U.S.C. 154(b) by 534 days.

(21) Appl. No.: 11/226,150

(22) Filed: Sep. 13, 2005

(65) Prior Publication Data

US 2007/0018505 A1 Jan. 25, 2007

(30) Foreign Application Priority Data

Jul. 19, 2005 (CN) .................... 2005 2 0114165 U

(51) Int. Cl.
*H05K 7/20* (2006.01)
*B23K 11/24* (2006.01)

(52) U.S. Cl. .................. 174/17 VA; 174/520; 174/547; 307/112

(58) Field of Classification Search ................... 174/50, 174/53, 57, 58, 50.59, 520, 526, 535, 542, 174/547, 15.1, 17 VA, 17 R; 361/600, 601, 361/704, 676; 307/112, 113; 200/334, 547, 200/330, 329; 362/580
See application file for complete search history.

(56) References Cited

U.S. PATENT DOCUMENTS 4,880,950 A * 11/1989 Carson et al. ............... 200/547
4,988,840 A * 1/1991 Carson et al. ............... 200/334
6,198,631 B1 * 3/2001 Radosavljevic et al. ..... 361/704
6,657,144 B2 * 12/2003 Savicki et al. ................. 174/53
6,734,381 B2 * 5/2004 Mayo et al. ................. 200/329
7,170,022 B2 * 1/2007 Krajci et al. ................ 200/547
7,332,683 B2 * 2/2008 Gorman ....................... 174/53

* cited by examiner

*Primary Examiner*—Angel R Estrada
(74) *Attorney, Agent, or Firm*—Chen Yoshimura LLP

(57) ABSTRACT

An improved light switch with light regulator is described. It includes a housing, a radiating aluminum plate, a panel frame, a micro-switch, a titling-board for the switch, a light regulator circuit board having mounted thereon a silicon controlled rectifier and an inductor. The housing is mounted on one side of the radiating aluminum plate and the panel frame and titling-board are located on the other side of the aluminum plate. The panel frame is provided with a sliding slit which accommodates a sliding button connected to a sliding variable resistor on the circuit board. The micro-switch, circuit board, silicon controlled rectifier and inductor are disposed inside the housing. A plurality of hollow plastic casings are provided between the circuit board and the radiating aluminum plate, a hollow copper rivet is provided inside each casing to rivet the circuit board and the radiating aluminum plate together.

11 Claims, 6 Drawing Sheets

LIGHT SWITCH WITH LIGHT REGULATOR

BACKGROUND OF THE INVENTION

1. Field of the Invention

This invention relates to electrical devices, and in particular, it relates to a light switch with light regulator.

2. Description of the Related Art

A regulator for a light is an electric device with relatively large power consumption and may produce a large amount of heat quantity during operation. If the heat is not effectively dissipated (radiated), the life of the product may be directly impacted. Conventional light regulator that uses a linear sliding control technique typically comprises a housing, a radiating aluminum plate, a panel frame, a micro-switch, a switching titling-board, a light regulator circuit board, a silicon controlled rectifier, an inductor mounted on the circuit board. The titling-board is pivotally connected to the panel frame with a spring between the two. The housing is mounted on one side of the radiating aluminum plate; the panel frame and the titling-board are mounted on the other side of the aluminum plate. On the panel frame there is a sliding slit, and within the sliding slit is a sliding button which is connected via a rod to a sliding variable resistor on the circuit board. Movement of the sliding button thus adjusts the light level. The micro-switch, light regulator circuit board, silicon controlled rectifier and inductor are disposed inside of the housing. The connection between the circuit board and radiating aluminum plate is by a plastic stand, which is small and sealed, making it inefficient for heat dissipation. The plastic stand is fixed with a clip which is not very secure and may become loose. The conventional light regulator uses a magnetic-ring inductor which occupies significant space within the limited space of the device. This forces the plastic stand to be short and small, reducing the effective radiating space and adversely affecting to the life of the product.

SUMMARY OF THE INVENTION

Accordingly, the present invention is directed to a light regulator device that substantially obviates one or more of the problems due to limitations and disadvantages of the related art.

An object of the present invention is to provide a linear sliding light regulator with more effective heat dissipation and a longer life.

Additional features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, the present invention provides an improved light switch with light regulator having a housing, a radiating metal plate, a panel frame, a micro-switch, a titling-board pivotally connected to the panel frame with a spring disposed therebetween, a light regulator circuit board having mounted thereon a silicon controlled rectifier, an inductor and a sliding variable resistor, a sliding slit defined on the panel frame, a sliding button accommodated in the sliding slit, the sliding button being connected to the sliding variable resistor, wherein the housing is mounted on one side of the radiating metal plate and the panel frame and titling-board are disposed on the other side of the radiating metal plate, and wherein the micro-switch, circuit board, silicon controlled rectifier and inductor are placed inside of the housing. The improvement includes: a plurality of hollow plastic casings disposed between the radiating metal plate and the circuit board; and a metal rivet or bolt through each casing for fastening the circuit board and the radiating metal plate together, wherein a space defined between the radiating metal plate and the circuit board is open on at least three sides.

It is to be understood that both the foregoing general description and the following detailed description are exemplary and explanatory and are intended to provide further explanation of the invention as claimed.

DETAILED DESCRIPTION OF THE PREFERRED EMBODIMENTS

Figure 1:
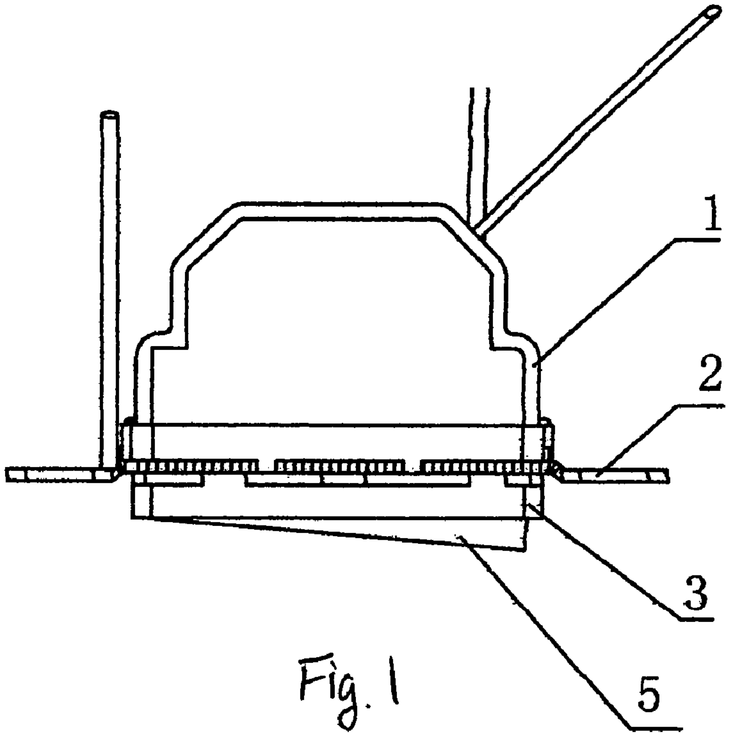
FIG. 1 is a top plan view of a light switch with light regulator according to an embodiment of the present invention.
Figure 2:
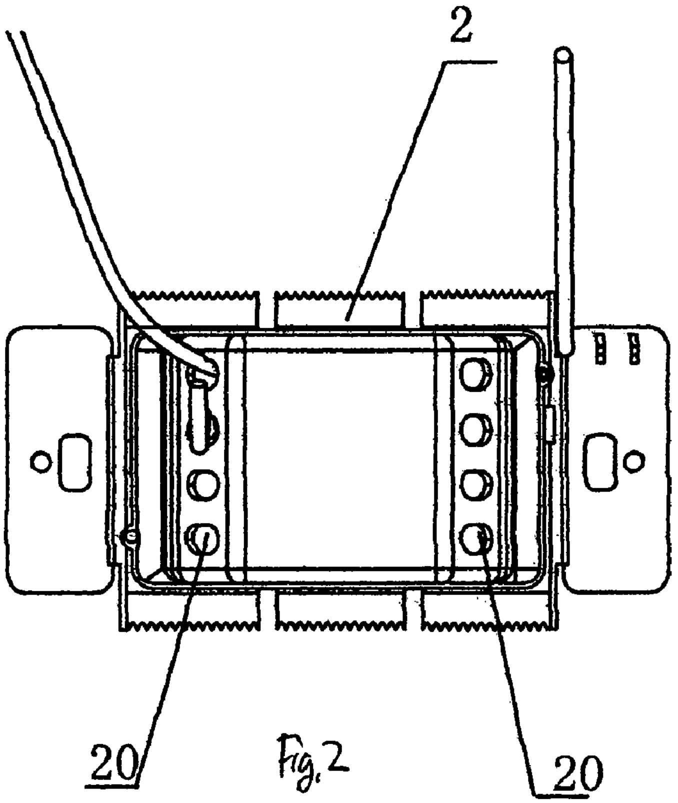
FIG. 2 is a back elevation view of the device of FIG. 1.
Figure 3:
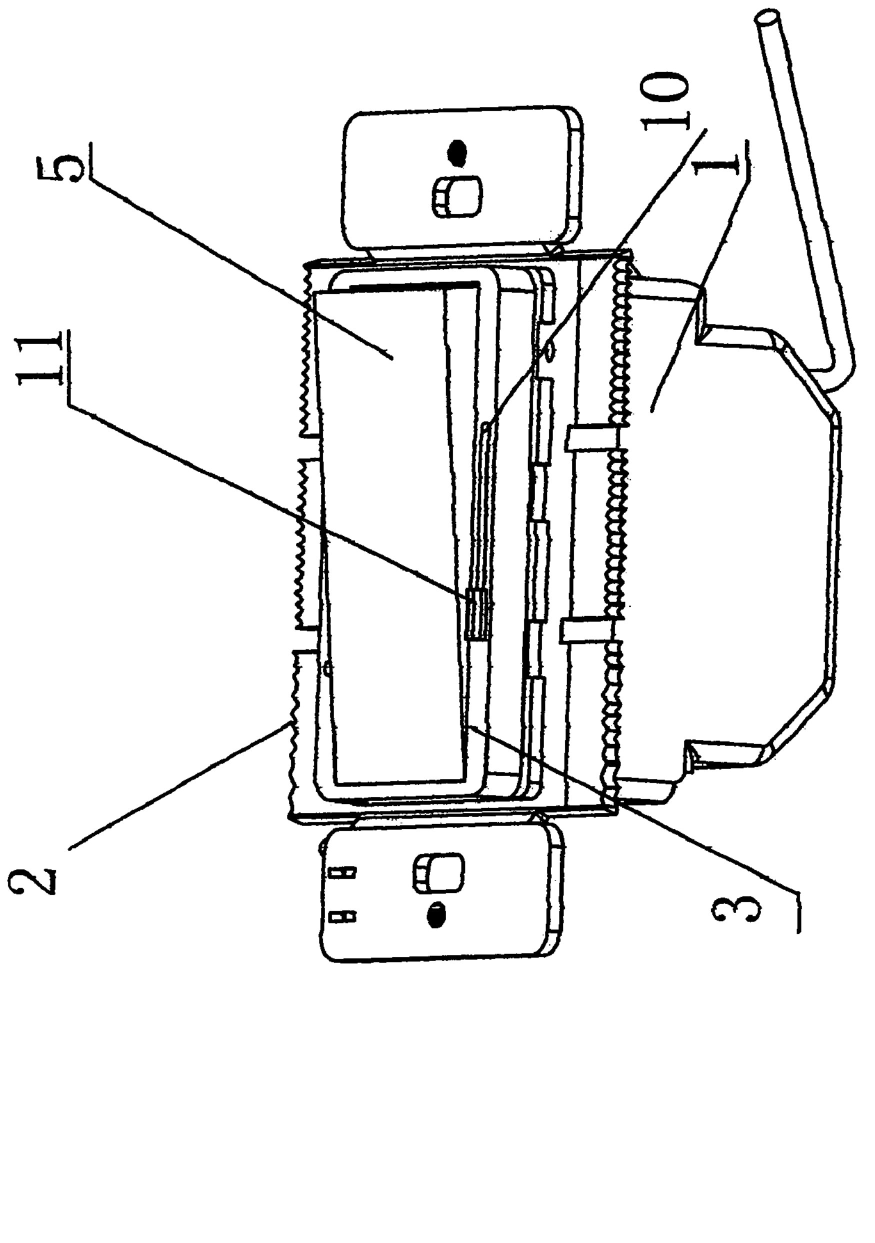
FIG. 3 is a perspective view of the device of FIG. 1.
Figure 4:
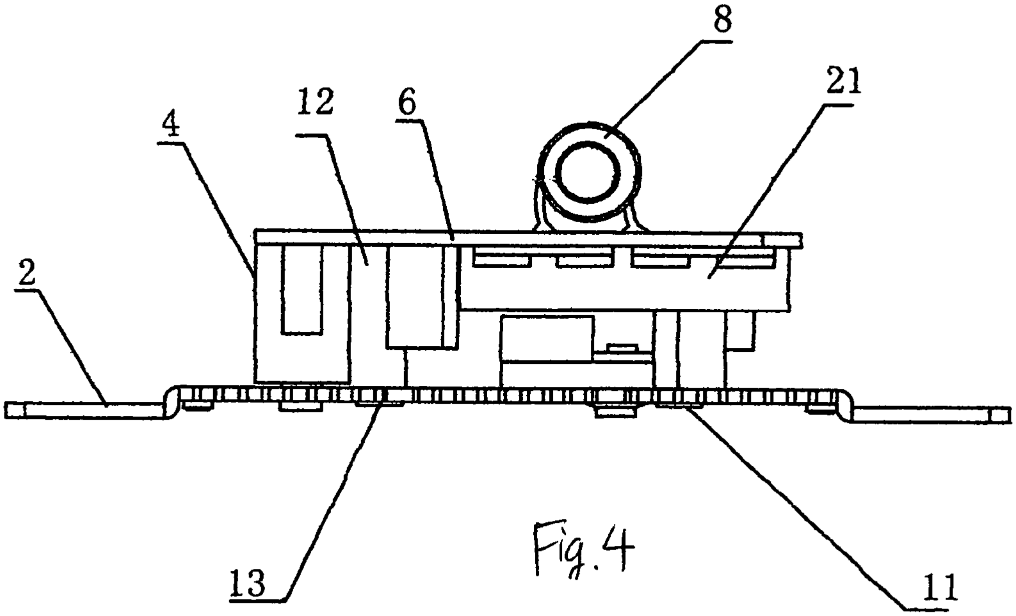
FIG. 4 is a top plan view showing interior structures of the device of FIG. 1.
Figure 5:
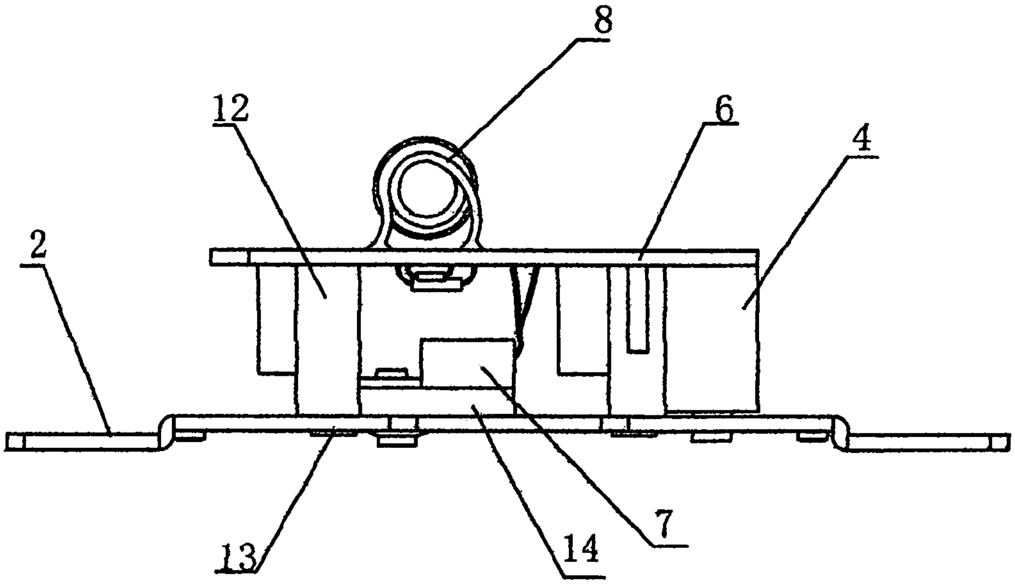
FIG. 5 is a bottom plan view showing interior structures of the device of FIG. 1.

Embodiments of the present invention are described with references to the drawings.

As shown in FIGS. 1-5, a linear sliding light regulator according to a preferred embodiment of the present invention consists of housing 1, radiating aluminum plate 2, panel frame 3, micro-switch 4, switching titling-board 5, light regulator circuit board 6, silicon controlled rectifier 7 and inductor 8. The inductor 8 is a magnet rod inductor and mounted on the circuit board 6. The titling-board 5 is pivotally connected to the lower side of the panel frame 3, and a spring 9 (FIG. 10) is connected in between the panel frame 3 and the titling-board 5. The housing 1 is securely mounted on the upper side of the radiating aluminum plate 2 while panel frame 3 and titling-board are mounted on the lower side of the aluminum plate 2. There is a sliding slit 10 on the panel frame 3, within which is a sliding button 11 connected to a sliding resistor 21 on the circuit board 6. The sliding button 11 may be substantially square in shape with four rounded comers. The micro-switch 4, light regulator circuit board 6, silicon controlled rectifier 7 and inductor 8 are disposed inside of the housing 1. There are four hollow plastic casings 12 disposed between the circuit board 6 and the radiating aluminum plate 2, and inside each of the hollow plastic casing 12 is a hollow copper rivet 13, which connect the circuit board 6 and radiating aluminum plate 2 together by way of riveting. In the preferred embodiment, the hollow plastic casings have a length of 16.5 mm, an outer diameter of 6 mm and an inner diameter of 3.2 mm; the hollow copper rivets have a length of 23 mm and a diameter of 3 mm. The silicon controlled rectifier 7 is set in between the circuit board 6 and the radiating aluminum plate 2 and connected to the former. A radiating block 14 is disposed on the radiating aluminum plate 2 and the silicon controlled rectifier 7 is mounted on the radiating block 14.

Figure 6:
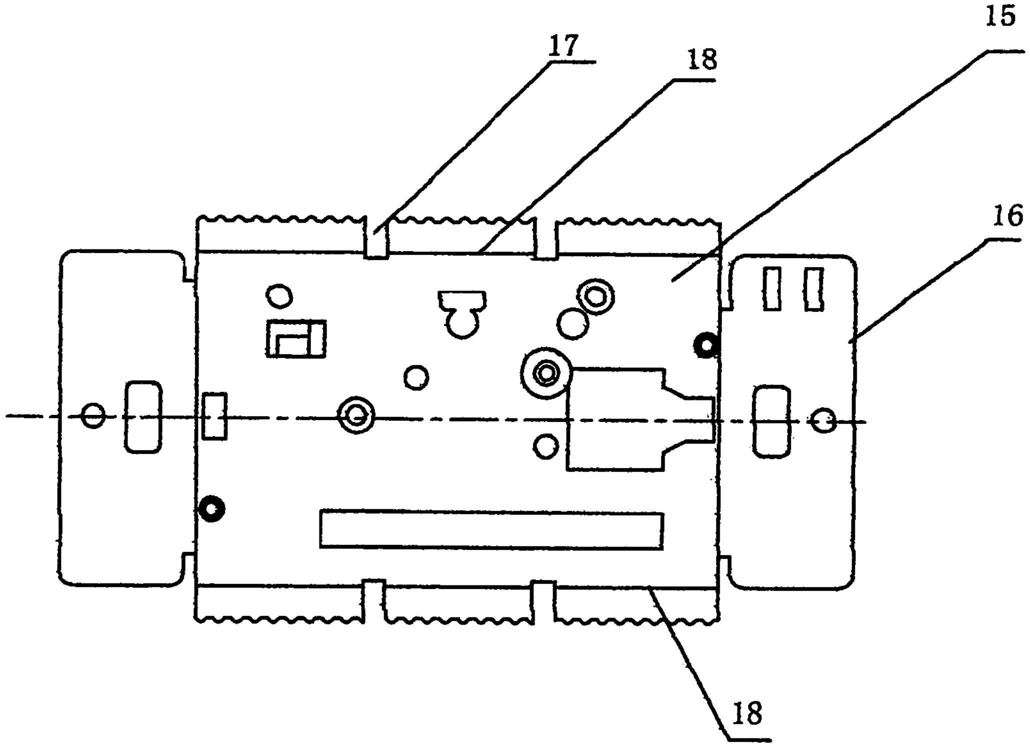
FIG. 6 is a front elevation view of an aluminum plate of the device of FIG. 1.
Figure 7:
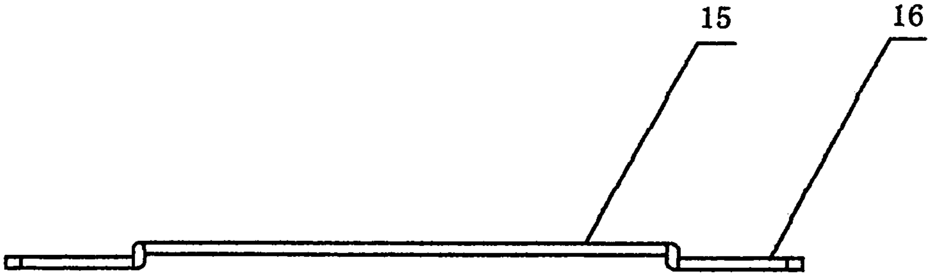
FIG. 7 is a top plan view of the aluminum plate of the device of FIG. 1.

As shown in FIGS. 6 and 7, the radiating aluminum plate may consist of a main plate 15 and mounting plates 16 on both ends. The part joining the main plate 15 and the mounting plate 16 are folded at right angles so that the radiating aluminum plate is not easily deformed. The two side edges of the main plate 15 are formed with saw tooth and notches 17. A punched downward folded line 18 is also formed along the two sides of the main plate 15. The saw tooth edges can enhance the radiating function of the main plate 15 and prevent it from deformation. The downward folded line 18 makes the device more convenient to use.

Figure 8:
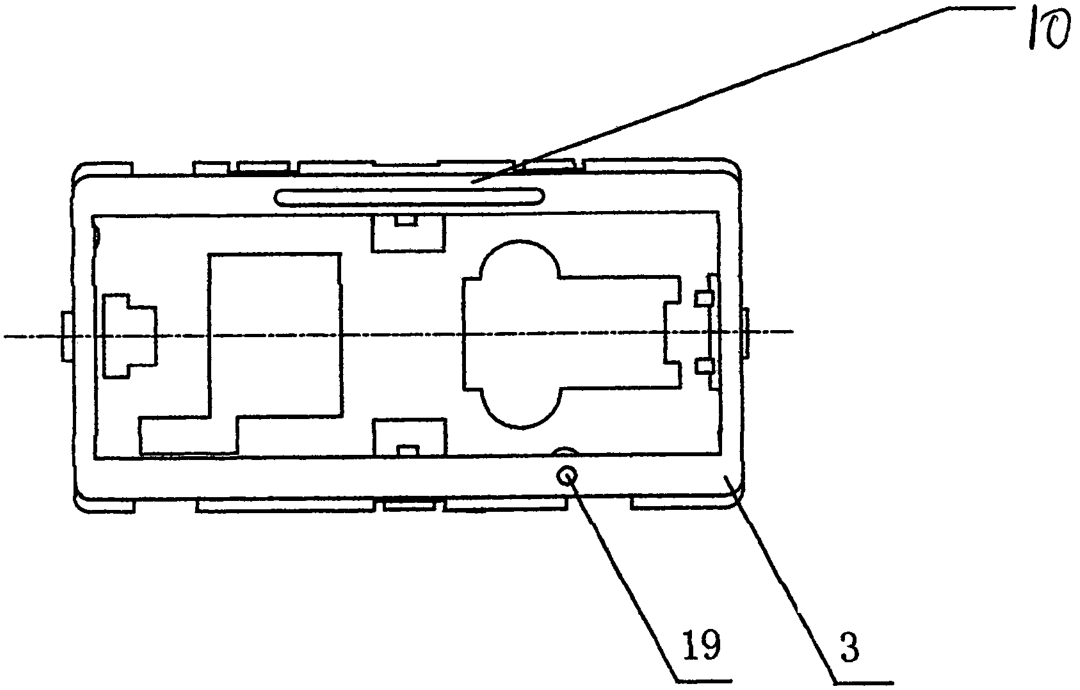
FIG. 8 is a front elevation view of a panel frame of the device of FIG. 1.
Figure 9:
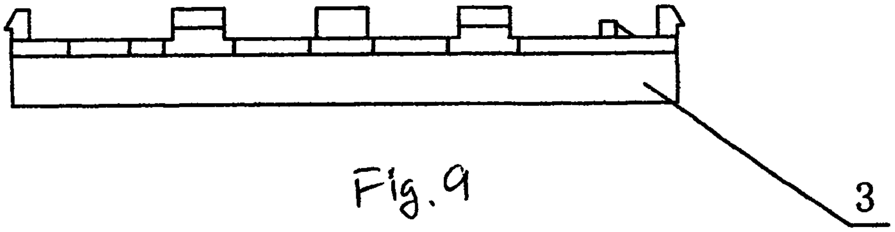
FIG. 9 is a top plan view of the panel frame of the device of FIG. 1.

As shown in FIGS. 8 and 9, the panel frame may be rectangular in shape. In the preferred embodiment, the width of the two longer sides is 4.16 mm and the widths of the two shorter sides are 2.29 mm and 2.17 mm, respectively. A hole 19 is provided for an indicator on the panel frame 3 to clearly indicate whether or not power is on. This is particularly convenient for use at night.

Figure 10:
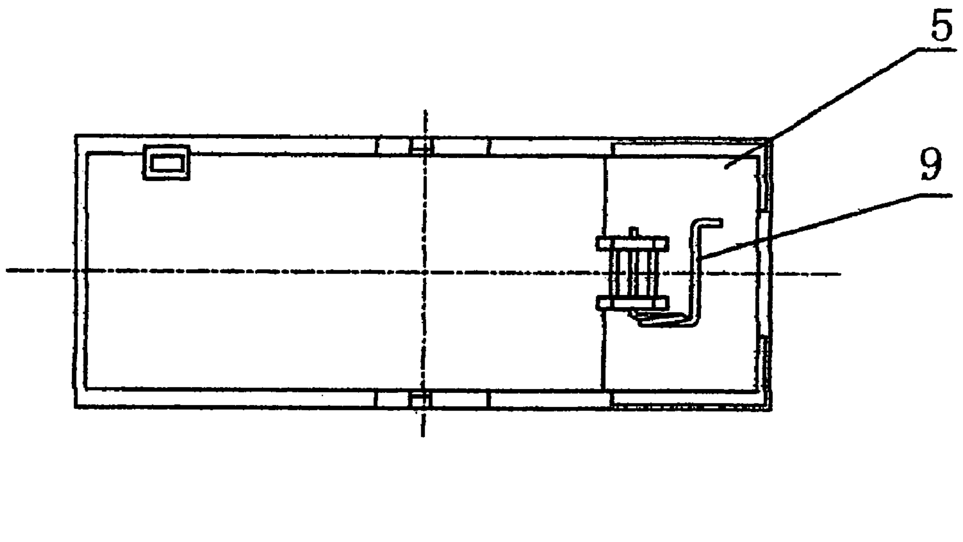
FIG. 10 is a back elevation view of a switching titling-board of the device of FIG. 1.
Figure 11:
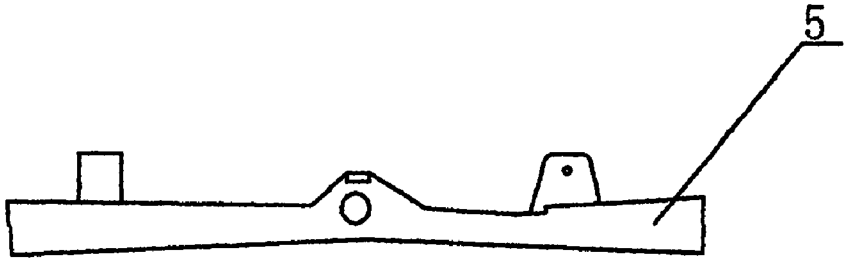
FIG. 11 is a top plan view of the switching titling-board of the device of FIG. 1.

As shown in FIGS. 10 and 11, the spring 9 mounted between the panel frame 3 and the titling-board 5 may be a torsion spring, one end of the spring being fixed on the panel frame 3 and the other end being fixed on the inner side of the titling board 5 via a hole on the tilting board 5. The use of a torsion spring makes the structure simpler, and differs from the conventional structure which typically uses a complicated multi-turn spiral spring which takes up a large space.

To increase the radiation effectiveness, long through holes 20 may be opened on both sides of the roof of the housing 1 of this embodiment (see FIG. 2), and a step may be formed on both ends to increase the internal space of the housing, thus reducing the temperature increase of the light regulator.

Compared with conventional devices, the preferred embodiment of the present invention has the following features and advantages: 1. The radiating aluminum plate is larger and more effective in its radiating function. 2. There are eight angled portions on the ends of the aluminum plate and all are upside-down inclined ones. 3. There are two through holes instead of four ones as in the conventional devices, resulting in less reduction in the radiating area. 4. There is one rectangular hole with inner beveling on each of the two ends of the aluminum plate. 5. The space between the aluminum plate and the circuit board is higher than in conventional devices, which facilitate the dissipation of heat. 6. The space between the radiating aluminum plate and the circuit board is open on at least three sides, which facilitate the dissipation of heat. 7. On the center of each two long sides of the titling-board there is a semi-triangular portion with a round hole for coupling to a tenon on each of the two long sides of the frame, making the structure sturdier. 8. Both ends of the sliding slit are arched, giving it a better feel for the user.

From the above description, it can be seen that a feature of the light switch according to a preferred embodiment of the present invention is the use of hollow plastic casings between the circuit board and the radiating aluminum plate and the use of hollow rivets inside the hollow plastic casings to fasten the circuit board and radiating aluminum plate together. This structure has the advantages that the plastic casings are long and thin and take up a relatively small space. The structure is strong and provides a large free space to enhance head dissipation.

Further, the use of the magnet rod inductor reduces the space required for the inductor and enables an arrangement of the electrical components on the circuit board that is more effective in heat dissipation.

Moreover, with a small radiating block in between the silicon controlled rectifier and the radiating aluminum plate and with the silicon controlled rectifier mounted on the radiating block, the temperature rise of the silicon controlled rectifier is greatly reduced. This enables the light regulator to stably and reliably work for a long time and increases the life of the product.

It will be apparent to those skilled in the art that various modification and variations can be made in the switch with light regulator of the present invention without departing from the spirit or scope of the invention. For example, although the radiating plate is made of aluminum in the preferred embodiment, other metals may be used. Although the rivets in side the plastic casing are made of copper in the preferred embodiment, other metals may be used. In addition to rivets, other fastening devices may be used such as bolts, pins, etc. Thus, it is intended that the present invention cover modifications and variations that come within the scope of the appended claims and their equivalents.

What is claimed is:

1. An improved light switch with light regulator comprising a housing, a radiating metal plate, a panel frame, a micro-switch, a titling-board pivotally connected to the panel frame with a spring disposed therebetween, a light regulator circuit board having mounted thereon a silicon controlled rectifier, an inductor and a sliding variable resistor, a sliding slit defined on the panel frame, a sliding button accommodated in the sliding slit, the sliding button being connected to the sliding variable resistor, wherein the housing is mounted on one side of the radiating metal plate and the panel frame and titling-board are disposed on the other side of the radiating metal plate, and wherein the micro-switch, circuit board, silicon controlled rectifier and inductor are placed inside of the housing, the improvement comprising:

a plurality of hollow plastic casings disposed between the radiating metal plate and the circuit board; and a metal rivet or bolt through each casing for fastening the circuit board and the radiating metal plate together, wherein a space defined between the radiating metal plate and the circuit board is open on at least three sides.

2. The improved light switch with light regulator of claim 1, comprising four hollow plastic casings and metal fastening devices, wherein each plastic casing has a length of about 16.5 mm, an outer diameter of about 6 mm and an inner diameter of about 3.2 mm, and wherein each metal fastening device has a length of 23 mm and a diameter of about 3 mm.

3. The improved light switch with light regulator of claim 1, further comprising a radiating block disposed on the radiating metal plate, wherein the silicon controlled rectifier is disposed on the radiating block between the circuit board and the radiating metal plate and is connected to the circuit board.

4. The improved light switch with light regulator of claim 1, wherein the inductor is a magnet rod inductor.

5. The improved light switch with light regulator of claim 1, wherein the panel frame is a rectangular in shape, a width of two long sides being about 4.16 mm widths of two short sides being about 2.29 mm and about 2.17 mm, respectively, and wherein the panel frame defines a hole for accommodating an indicator.

6. The improved light switch with light regulator of claim 1, wherein the spring between the panel frame and the titling-board is a torsion spring, one end of the spring being fixed on the panel frame and the other end being fixed on an inner side of the titling-board, and wherein the center of each two long sides of the titling-board is provided with is a semi-triangular portion with a round hole for coupling to a tenon provided on two sides of the frame.

7. The improved light switch with light regulator of claim 1, wherein a plurality of through holes are defined on two sides of a roof of the housing.

8. The improved light switch with light regulator of claim 1, wherein the radiating metal plate includes a main plate, two mounting plates on both ends, and a part joining the main plate and the mounting plate and folded at right angles, wherein two side edges of the main plate are formed with saw tooth and notches, and wherein a punched downward folded line is formed along the two sides of the main plate.

9. The improved light switch with light regulator of claim 8, wherein each edge of the mounting plates of the radiating metal plate form an upside-down inclined angle, and wherein a through-hole is defined on each of the mounting plates.

10. The improved light switch with light regulator of claim 1, wherein the sliding slit has two round shaped ends, and wherein the sliding button is rectangular in shape with four rounded corners.

11. The improved light switch with light regulator of claim 1, wherein the metal plate is made of aluminum.

* * * * *